(12) United States Patent
Wen

(10) Patent No.: US 11,721,121 B2
(45) Date of Patent: Aug. 8, 2023

(54) MOBILE TERMINAL COMPRISING DISPLAY SCREEN, FLEXIBLE CIRCUIT BOARD, LIGHT SOURCE, OPTICAL FINGERPRINT MODULE, AND ANNULAR LIGHT GUIDE, A FINGERPRINT RECOGNITION AREA LOCATED IN ANNULAR RING OF ANNULAR LIGHT GUIDE, AND ANNULAR LIGHT-SHIELDING PART LOCATED ON SURFACE OF ANNULAR LIGHT GUIDE AWAY FROM DISPLAY SCREEN

(71) Applicant: VIVO MOBILE COMMUNICATION CO., LTD., Chang'an Dongguan (CN)

(72) Inventor: Kesheng Wen, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 153 days.

(21) Appl. No.: 16/958,357

(22) PCT Filed: Nov. 30, 2018

(86) PCT No.: PCT/CN2018/118485
§ 371 (c)(1),
(2) Date: Jun. 26, 2020

(87) PCT Pub. No.: WO2019/128617
PCT Pub. Date: Jul. 4, 2019

(65) Prior Publication Data
US 2021/0064840 A1    Mar. 4, 2021

(30) Foreign Application Priority Data

Dec. 26, 2017 (CN) .......................... 201711432709.9

(51) Int. Cl.
*G06V 40/13* (2022.01)
*H10K 59/65* (2023.01)
*H01L 27/146* (2006.01)

(52) U.S. Cl.
CPC .......... *G06V 40/1318* (2022.01); *H10K 59/65* (2023.02); *H01L 27/14623* (2013.01); *H01L 27/14625* (2013.01); *H01L 27/14678* (2013.01)

(58) Field of Classification Search
CPC ............... G06F 21/32; G06F 3/0416; G06F 2203/04105; G06K 9/0004; G06K 9/00013; G09G 2330/026; G09G 2354/00
See application file for complete search history.

(56) References Cited

U.S. PATENT DOCUMENTS

| | | | |
|---|---|---|---|
| 2015/0226907 A1* | 8/2015 | Hu | .......................... G02B 6/002 362/611 |
| 2015/0242673 A1 | 8/2015 | Singhai | |

(Continued)

FOREIGN PATENT DOCUMENTS

| | | | |
|---|---|---|---|
| CN | 101276406 A | 10/2008 | |
| CN | 204791058 U * | 11/2015 | ............... G06K 9/00 |

(Continued)

OTHER PUBLICATIONS

International Search Report & Written Opinion related to Application No. PCT/CN2018/118485; reported on Jul. 9, 2020.

(Continued)

*Primary Examiner* — Yuzhen Shen
(74) *Attorney, Agent, or Firm* — von Briesen & Roper, s.c.

(57) ABSTRACT

A mobile terminal is provided. The mobile terminal includes a display screen; a flexible circuit board below the display screen and being provided with a first light source; an optical fingerprint module below the display screen, wherein a (Continued)

fingerprint recognition area is disposed on a surface of the optical fingerprint module facing the display screen, and the flexible circuit board is located outside the optical fingerprint module; a light guide part disposed at the periphery of the fingerprint recognition area and capable of receiving light emitted by the first light source.

7 Claims, 2 Drawing Sheets

(56) References Cited

U.S. PATENT DOCUMENTS

| | | | |
|---|---|---|---|
| 2017/0192565 A1* | 7/2017 | Pan | G02B 6/0083 |
| 2017/0270342 A1 | 9/2017 | He et al. | |
| 2018/0053030 A1 | 2/2018 | Zhang | |
| 2018/0053031 A1* | 2/2018 | Lin | H01L 27/14618 |
| 2018/0160545 A1* | 6/2018 | Kim | G02F 1/1333 |
| 2018/0211090 A1 | 7/2018 | Yang | |
| 2018/0315803 A1 | 11/2018 | Jin | |
| 2019/0057642 A1* | 2/2019 | Kim | G06K 9/0004 |
| 2020/0046235 A1* | 2/2020 | Jung | A61B 5/6898 |

FOREIGN PATENT DOCUMENTS

| | | | | |
|---|---|---|---|---|
| CN | 105160334 A | | 12/2015 | |
| CN | 205644579 U | | 10/2016 | |
| CN | 106295590 A | | 1/2017 | |
| CN | 106506741 A | | 3/2017 | |
| CN | 206178862 U | | 5/2017 | |
| CN | 106991383 A | | 7/2017 | |
| CN | 107077554 A | | 8/2017 | |
| CN | 107193412 A | | 9/2017 | |
| CN | 107231461 A | | 10/2017 | |
| CN | 108183982 A | | 6/2018 | |
| CN | 109284657 A | * | 1/2019 | ......... G06V 40/1318 |
| KR | 20150059470 A | | 6/2015 | |
| WO | 2017211152 A1 | | 12/2017 | |

OTHER PUBLICATIONS

Chinese Search Report for related Application No. 201711432709.9; reported on Nov. 15, 2018.

Extended European Search Report for related Application No. 18896055.3; reported on Feb. 23, 2021.

* cited by examiner

MOBILE TERMINAL COMPRISING DISPLAY SCREEN, FLEXIBLE CIRCUIT BOARD, LIGHT SOURCE, OPTICAL FINGERPRINT MODULE, AND ANNULAR LIGHT GUIDE, A FINGERPRINT RECOGNITION AREA LOCATED IN ANNULAR RING OF ANNULAR LIGHT GUIDE, AND ANNULAR LIGHT-SHIELDING PART LOCATED ON SURFACE OF ANNULAR LIGHT GUIDE AWAY FROM DISPLAY SCREEN

CROSS-REFERENCE TO RELATED APPLICATION

This application is the U.S. national phase of PCT Application No. PCT/CN2018/118485 filed on Nov. 30, 2018, which claims priority to a Chinese patent application No. 201711432709.9 filed in China on Dec. 26, 2017, the disclosures of which are incorporated herein by reference in their entirety.

TECHNICAL FIELD

The present disclosure relates to the field of an electronic device, and more particularly, to a mobile terminal.

BACKGROUND

With the development of an "all screen" in a mobile terminal, such as a mobile phone, there is no separate space for accommodating a fingerprint structure on the front of a display screen, and in future trend of development is that space for the display screen and space for a fingerprint structure are combined together, that is, the fingerprint structure is designed in the display screen.

In the related art, when a fingerprint structure in a display screen of a mobile phone product is in a standby state, a user is instructed, by continuous light-emitting (working) of a body of the display screen, to perform a fingerprint unlock in a corresponding fingerprint sensing area. This causes unnecessary work of the display screen, reduces a lifetime of the display screen, and, the continuous working of the display screen consumes a large amount of power of the battery in the mobile terminal, reduces a battery life of the mobile terminal, and affects a satisfaction degree of a user.

SUMMARY

An embodiment of the present disclosure provides a mobile terminal. The mobile terminal includes a display screen; a flexible circuit board below the display screen, the flexible circuit board being provided with a first light source; an optical fingerprint module below the display screen, wherein a fingerprint recognition area is disposed on a surface of the optical fingerprint module facing the display screen, and the flexible circuit board is located outside the optical fingerprint module; a light guide part arranged at a periphery of the fingerprint recognition area and capable of receiving light emitted by the first light source.

REFERENCE NUMERALS: IN THE DRAWINGS

1—display screen, 2—light-emitting area, 3—first light source, 4—optical fingerprint module. 5—light guide part, 6—light-shielding part;

DETAILED DESCRIPTION

Technical solutions in the embodiments of the present disclosure will be described more clearly and completely below in connection with the accompanying drawings in the embodiments of the present disclosure, and it will be apparent that the described embodiments are a part, rather than all, of the embodiments of the present disclosure. Based on the embodiments in the present disclosure, all other embodiments obtained by a person of ordinary skill in the art without paying any inventive effort are within the protection scope of the present disclosure.

Figure 1:
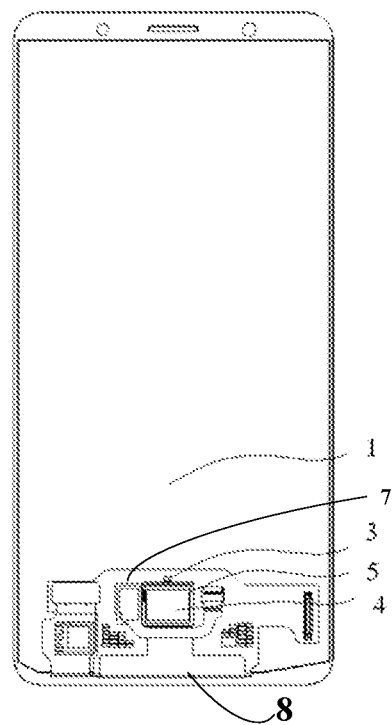
FIG. 1 shows a first structural diagram of a mobile terminal in an embodiment of the present disclosure.
Figure 2:
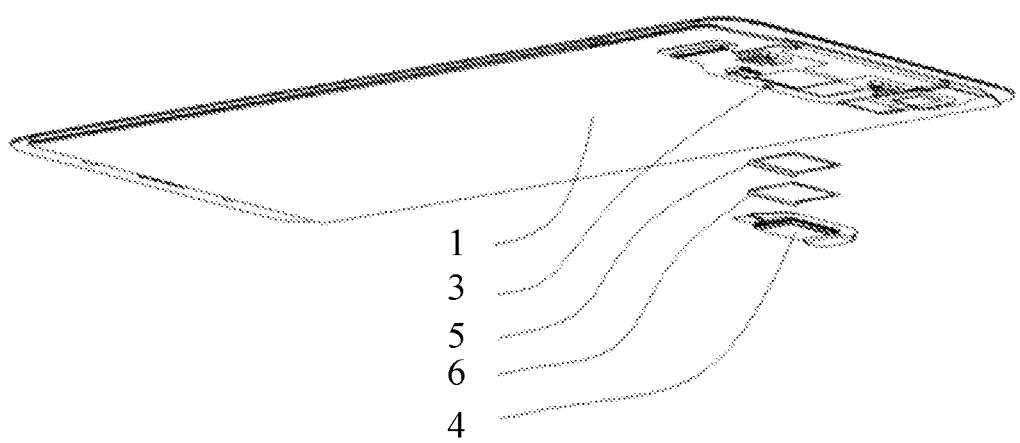
FIG. 2 shows a second structural diagram of a mobile terminal in an embodiment of the present disclosure.

An embodiment of the present disclosure provides a mobile terminal. As shown in FIG. 1 and FIG. 2, the mobile terminal includes: a display screen 1; a first flexible circuit board 7 arranged below the display screen 1, the first flexible circuit board 7 being provided with a first light source 3; an optical fingerprint module 4 arranged below the display screen 1, a fingerprint recognition area being disposed on a surface of the optical fingerprint module 4 facing the display screen 1, and the first flexible circuit board 7 being located outside the optical fingerprint module 4; a light guide part 5 provided around the fingerprint recognition area and capable of receiving light emitted from the first light source 3.

In this structure, the first light source 3 is added to a region of the first flexible circuit board 7 located outside the optical fingerprint module 4, and the first light source 3 is powered by the first flexible circuit board. When the first light source is in an operation state, emitted light is transmitted to the periphery of the fingerprint recognition area through the light guide part 5, and the periphery of the fingerprint recognition area on the optical fingerprint module 4 is illuminated. The light transmitted by the light guide part 5 is displayed to the user after passing through the display screen 1, and the user knows a location of the fingerprint recognition area accordingly, so as to guide the user to realize fingerprint recognition and a corresponding fingerprint matching process in a light-emitting area (i.e., the fingerprint recognition area of the optical fingerprint module 4) of the display screen. Light emission from the display screen is not required. The light emission from the first light source 3 externally arranged is used to guide the user to press at the fingerprint recognition area of the optical fingerprint module 4 for unlocking, and the body of the display screen body is not required to continuously emit light, thereby reducing power consumption of using the mobile terminal, reducing a failure risk of the display screen, prolonging the lifetime of the display screen, and ensuring that a battery of the mobile terminal has sufficiently long lifetime.

Figure 3:
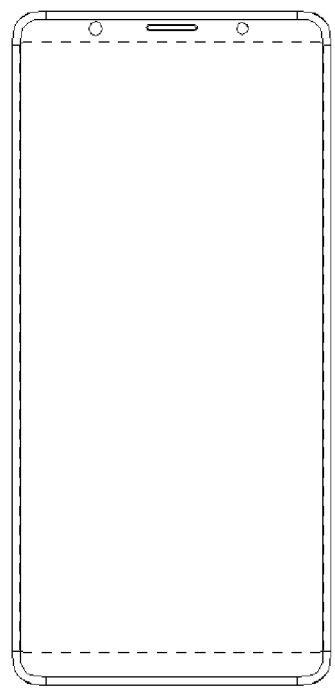
FIG. 3 shows an appearance state of a display screen when a first light source is not in operation in an embodiment of the present disclosure.
Figure 4:
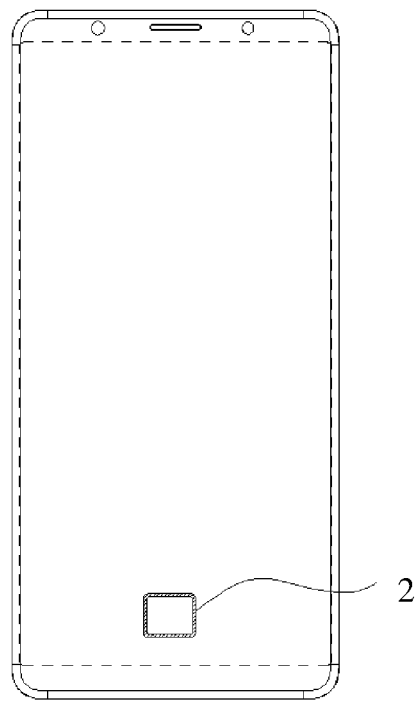
FIG. 4 shows an appearance effect of the display screen when the first light source is in operation in an embodiment of the present disclosure.

As shown in FIG. 3, FIG. 3 shows an appearance effect of the display screen when the first light source 3 is not in operation. As shown in FIG. 4, FIG. 4 shows an appearance effect in case that light emitted from the first light source 3 passes through the light guide part 5 and penetrates through the display screen when the first light source 3 is in operation. When the first light source 3 is in operation, a light-emitting area 2 is formed on the display screen 1, and the user is guided to press the area for unlocking. Specifically, the optical fingerprint module 4 can collect a user's fingerprint in the area by means of laser-scanning, a sound wave, or the like, and then perform matching and recognition. A light-emitting pattern in the area can be adjusted according to a requirement of a product.

Optionally, the first light source 3 is a Light Emitting Diode (LED) lamp.

Light rays emitted from the first light source 3 need to pass through the light guide part 5 before penetrating through the display screen 1. By adjusting an appearance and a design of the light guide part 5, different shapes and different effects, such as bright, dark, strong and weak, of the light rays can be achieved. Different LED lights, such as a white light, a red light, a yellow light, and the like may also be used, to achieve different appearance effects.

Optionally, the optical fingerprint module 4 and the display screen 1 are adhesively bonded together, and a bonding between the optical fingerprint module 4 and the display screen 1 is firm and easy to operate.

Optionally, the first flexible circuit board 7 is connected to a second flexible circuit board 8 of the display screen 1 or to the optical fingerprint module 4.

As an optional embodiment, the mobile terminal further includes a controller connected to the first light source 3 and controlling the first light source 3 to emit light intermittently.

In an example that the mobile terminal is a product such as a mobile phone, when the mobile terminal is in a standby state, the first light source 3 is controlled to emit light intermittently by the controller. Light is emitted along the periphery of the fingerprint recognition area in the optical fingerprint module 4 by means of the light guide 5, and the light penetrates through the display screen 1 to guide the user to press the light-emitting area(i.e., a region of the optical fingerprint module 4) in the display screen 1 for unlocking.

Further, when light emission by the display screen 1 needs to be supported by an external light source, the controller is also connected to a second light source of the display screen 1, and the controller controls the first light source 3 to be turned off when the second light source of the display screen 1 is in an illuminated state.

The controller is connected to the first light source 3 and the second light source. The second light source is a screen light source in the display screen 1. The controller controls turning-on or turning-off of the first light source 3 or the second light source. By controlling the first light source 3 to be turned off when the second light source is turned on, display at the fingerprint recognition area is realized by the first light source 3 which is independently arranged, when the display screen 1 is turned off. When the display screen 1 is turned on, fingerprint verification is not required; in this case, the first light source 3 needs to be controlled to be turned off, that is, when a mobile phone product is operated in an on-screen state, the first light source does not work, so as to save a power consumption and meet needs of practical applications.

Optionally, when the display screen 1 is a self-luminous display screen, the controller is further connected to the display screen 1, and the controller controls the first light source 3 to be turned off when the display screen 1 is in an illuminated state, so that the display at the fingerprint recognition area is realized by the first light source 3 independently provided when the display screen 1 is turned off, wherein the self-luminous display screen 1 is specifically made of an Organic Light-Emitting Diode (OLED).

Optionally, the light guide part 5 is an annular light guide, wherein the fingerprint recognition area is located in an annular ring of the annular light guide.

Here, the light guide part 5 is optionally designed to have an annular ring shape to keep away from the fingerprint recognition area located in a central area of the optical fingerprint module 4, thereby ensuring an unlocking sensitivity of the fingerprint module.

Further, an annular light-shielding part 6 is located on a surface of the annular light guide away from the display screen 1, so as to ensure that light rays transmitted by the light guide part 5 do not leak out at a back surface of the light guide 5, and to ensure that light rays emitted from the display screen 1 are sufficiently bright.

Optionally, the light guide part 5 is a light guide film, and the light-shielding part 6 is a light-shielding adhesive paper, thereby saving costs and reducing a volume of the structure.

It is to be noted that, in this context, such terms as "comprise", "comprising", "include", "including" or any other variation thereof, are intended to cover a non-exclusive inclusion, such that a process, a method, an article, or an apparatus that include a list of elements includes not only those elements but also other elements not expressly listed, or also includes elements inherent to such process, method, article, or apparatus, Without more limitations, a process, method, article, or apparatus defined by such an expression as "including an element" does not rule out existence of additional identical elements in the process, method, article, or apparatus that includes the element.

From the above description of the embodiments, it will be apparent to those skilled in the art that methods in the above embodiments may be implemented by means of software plus a necessary general hardware platform, but may be also implemented by means of hardware, but in many cases the former is a preferred embodiment. Based on such an understanding, an essential part, or a part contributing to the relevant part, of technical solutions of the present disclosure may be embodied in the form of a software product stored in a storage medium (e.g., Read-Only Memory (ROM)/Random Access Memory (RAM), a magnetic disk, an optical disk), including instructions for causing a terminal (which may be a mobile phone, a computer, a server, an air conditioner, or a network device) to perform the methods described in the various embodiments of the present disclosure.

The embodiments of the present disclosure have been described above in connection with the accompanying drawings, but the present disclosure is not limited to the specific embodiments described above. The specific embodiments described above are merely illustrative and not restrictive, and those of ordinary skill in the art will be able to, under inspiration of the present disclosure, make many form variations without departing from the spirit of the present disclosure and the protection scope of the claims, all of which fall within the protection scope of the present disclosure.

The foregoing are optional embodiments of the present disclosure, it should be noted that several modifications and embellishments may be made by those of ordinary skill in the art without departing from the principles set forth herein, and such modifications and embellishments are also within the protection scope of the present disclosure.

What is claimed is:

1. A mobile terminal, comprising:
a display screen;

a first flexible circuit board below the display screen, the first flexible circuit board being provided with a first light source;

an optical fingerprint module below the display screen, wherein a fingerprint recognition area is disposed on a surface of the optical fingerprint module facing the display screen, and the first flexible circuit board is located outside the optical fingerprint module;

a light guide part arranged at a periphery of the fingerprint recognition area and capable of receiving light emitted by the first light source, wherein, the light guide part is an annular light guide, and the fingerprint recognition area is located in an annular ring of the annular light guide, the light guide part is a light guide film, an annular light-shielding part is located on a surface of the annular light guide away from the display screen, wherein, a projection, on a plane in which the annular light guide is located, of an entirety of the first light source is outside an outer contour of a projection of the annular light guide on the plane in which the annular light guide is located, the first flexible circuit board is connected to a second flexible circuit board of the display screen, and the optical fingerprint module, the light guide part, and the first light source are located on a surface, away from the display screen, of the first flexible circuit board.

2. The mobile terminal according to claim 1, further comprising:

a controller connected to the first light source and configured to control the first light source to emit light intermittently.

3. The mobile terminal according to claim 2, wherein the controller is further connected to a second light source of the display screen, and the controller controls the first light source to be turned off when the second light source of the display screen is in an illuminated state.

4. The mobile terminal according to claim 2, wherein the display screen is a self-luminous display screen, the controller is further connected to the display screen, and the controller controls the first light source to be turned off when the display screen is in an illuminated state.

5. The mobile terminal according to claim 1, wherein the light-shielding part is a light-shielding adhesive paper.

6. The mobile terminal according to claim 1, wherein the first light source is an LED lamp.

7. The mobile terminal according to claim 1, wherein, the first light source is located at a region of the first flexible circuit board located outside the optical fingerprint module, and the first light source is powered by the first flexible circuit board.

* * * * *